(12) United States Patent
Araki et al.

(10) Patent No.: US 11,196,065 B2
(45) Date of Patent: Dec. 7, 2021

(54) OUTPUT PERFORMANCE DIAGNOSIS APPARATUS FOR FUEL CELL, OUTPUT PERFORMANCE DIAGNOSIS SYSTEM FOR FUEL CELL, OUTPUT PERFORMANCE DIAGNOSIS METHOD FOR FUEL CELL, AND NON-TRANSITORY COMPUTER READABLE MEDIUM STORING OUTPUT PERFORMANCE DIAGNOSIS PROGRAM FOR FUEL CELL

(71) Applicant: TOYOTA JIDOSHA KABUSHIKI KAISHA, Toyota (JP)

(72) Inventors: Yasushi Araki, Gotenba (JP); Masaaki Matsusue, Mishima (JP); Masayuki Ito, Sunto-gun Shizuoka-ken (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 675 days.

(21) Appl. No.: 15/671,769

(22) Filed: Aug. 8, 2017

(65) Prior Publication Data
US 2018/0083298 A1    Mar. 22, 2018

(30) Foreign Application Priority Data
Sep. 16, 2016    (JP) .............................. JP2016-182275

(51) Int. Cl.
*G01R 31/396*    (2019.01)
*H01M 8/04537*    (2016.01)
(Continued)

(52) U.S. Cl.
CPC ......... *H01M 8/04611* (2013.01); *B60L 58/30* (2019.02); *B60L 58/40* (2019.02);
(Continued)

(58) Field of Classification Search
CPC ......... H01M 8/04611; H01M 8/04559; H01M 8/04619; H01M 8/04641; H01M 8/04649;
(Continued)

(56) References Cited

U.S. PATENT DOCUMENTS

2009/0061263 A1    3/2009  Watanabe
2009/0230917 A1*   9/2009  Kojima ................... B60L 58/10
                                                        320/101

(Continued)

FOREIGN PATENT DOCUMENTS

JP    2007-207442 A    8/2007
JP    2009-146744 A    7/2009
(Continued)

*Primary Examiner* — Melissa J Koval
*Assistant Examiner* — Courtney G McDonnough
(74) *Attorney, Agent, or Firm* — Hunton Andrews Kurth LLP

(57) ABSTRACT

An output performance diagnosis apparatus for a fuel cell acquires, in a case where determination is made that a representative value of impedance of the fuel cell acquired during a trip of a vehicle traveling with a fuel cell as a power source is equal to or less than an impedance threshold, during the trip in which the impedance is acquired, a current-voltage characteristic of the fuel cell based on a change of an output voltage of the fuel cell after a period in which the output voltage of the fuel cell is maintained in a range equal to or higher than a lower limit voltage and equal to or lower than a voltage threshold higher than the lower limit voltage over a predetermined period or more, and calculates maximum output electric power of the fuel cell based on the acquired current-voltage characteristic.

9 Claims, 9 Drawing Sheets

(51) Int. Cl.
*G01R 31/389* (2019.01)
*B60L 58/30* (2019.01)
*B60L 58/40* (2019.01)
*G01R 31/36* (2020.01)

(52) U.S. Cl.
CPC ....... *G01R 31/3648* (2013.01); *G01R 31/389* (2019.01); *H01M 8/04559* (2013.01); *H01M 8/04619* (2013.01); *H01M 8/04641* (2013.01); *H01M 8/04649* (2013.01); *B60L 2250/16* (2013.01); *B60L 2260/54* (2013.01); *H01M 2250/20* (2013.01); *Y02T 90/40* (2013.01)

(58) Field of Classification Search
CPC ........... H01M 2250/20; G01R 31/3648; G01R 31/389; B60L 11/1881; B60L 11/1887; B60L 2250/16; B60L 2260/54; Y02T 90/32; Y02T 90/34
USPC .......................................................... 324/430
See application file for complete search history.

(56) References Cited

U.S. PATENT DOCUMENTS

| | | | | |
|---|---|---|---|---|
| 2009/0266631 | A1* | 10/2009 | Kikuchi | H01M 10/44 180/65.265 |
| 2010/0092819 | A1* | 4/2010 | Umayahara | B60L 58/40 429/446 |
| 2010/0286939 | A1* | 11/2010 | Oh | G01R 31/389 702/65 |
| 2010/0287126 | A1* | 11/2010 | Kawase | H01M 8/04089 706/12 |
| 2012/0183873 | A1 | 7/2012 | Matsusue et al. | |
| 2014/0080024 | A1* | 3/2014 | Igarashi | H01M 8/04723 429/437 |
| 2016/0126574 | A1* | 5/2016 | Bono | H01M 8/04992 429/431 |

FOREIGN PATENT DOCUMENTS

| | | |
|---|---|---|
| JP | 2011-192458 A | 9/2011 |
| WO | 2011/036765 A1 | 3/2011 |

* cited by examiner

OUTPUT PERFORMANCE DIAGNOSIS APPARATUS FOR FUEL CELL, OUTPUT PERFORMANCE DIAGNOSIS SYSTEM FOR FUEL CELL, OUTPUT PERFORMANCE DIAGNOSIS METHOD FOR FUEL CELL, AND NON-TRANSITORY COMPUTER READABLE MEDIUM STORING OUTPUT PERFORMANCE DIAGNOSIS PROGRAM FOR FUEL CELL

INCORPORATION BY REFERENCE

The disclosure of Japanese Patent Application No. 2016-182275 filed on Sep. 16, 2016 including the specification, drawings and abstract is incorporated herein by reference in its entirety.

BACKGROUND

1. Technical Field

The present disclosure relates to an output performance diagnosis apparatus for a fuel cell, an output performance diagnosis system for a fuel cell, an output performance diagnosis method for a fuel cell, and a non-transitory computer readable medium storing an output performance diagnosis program for a fuel cell.

2. Description of Related Art

Hitherto, a technique that acquires a current-voltage characteristic (hereinafter, referred to as an IV characteristic) of a fuel cell mounted in a vehicle as a power source for traveling is known (for example, see WO 2011/036765). It is considered that maximum output electric power outputable from the fuel cell is calculated based on the IV characteristic, and the output performance of the fuel cell is ascertained.

SUMMARY

Degradation of the output performance of the fuel cell includes irreversible degradation with an increase in a use period of the fuel cell and reversible degradation that can be recovered according to an operation state of the fuel cell. Accordingly, not only irreversible degradation of output performance but also reversible degradation of output performance can be reflected in the IV characteristic of the fuel cell. For this reason, even if the IV characteristic is acquired in a state in which reversible degradation is generated, it is not possible to calculate the maximum output electric power potentially outputable from the fuel cell in a state in which reversible degradation is recovered.

For this reason, it is considered that the IV characteristic is acquired in a state in which reversible degradation is recovered by controlling the operation state of the fuel cell, and the maximum output electric power potentially outputable from the fuel cell is calculated. It is known that reversible degradation of output performance can be recovered by increasing relative humidity inside the fuel cell while decreasing an output voltage of the fuel cell by operating the fuel cell with high output. For this reason, it is considered that the IV characteristic is acquired after reversible degradation of output performance is recovered by operating the fuel cell with high output in advance. However, in this case, it is necessary to operate the fuel cell with high output separately from a driver's driving operation, and there is a possibility that the fuel consumption of the fuel cell increases.

As described above, even in a state in which reversible degradation of output performance is recovered, variation in relative humidity inside the fuel cell occurs under a condition of environmental humidity or environmental temperature at which the fuel cell is used. Accordingly, variation in the IV characteristic acquired also occurs under a condition that the relative humidity is likely to vary, and there is a possibility that the output performance indicated by the IV characteristic is degraded to be less than the original potential output performance. As a result, even if the IV characteristic is acquired under such a condition, there is a possibility that it is not possible to calculate the maximum output electric power potentially outputable from the fuel cell with high accuracy.

The disclosure provides an output performance diagnosis apparatus for a fuel cell, an output performance diagnosis system for a fuel cell, an output performance diagnosis method for a fuel cell, and a non-transitory computer readable medium storing an output performance diagnosis program for a fuel cell capable of calculating maximum output electric power potentially outputable from the fuel cell with high accuracy while suppressing an increase in fuel consumption of the fuel cell.

A first aspect of the disclosure relates to an output performance diagnosis apparatus for a fuel cell. The output performance diagnosis apparatus includes a calculation unit. The calculation unit is programmed to, in a case where determination is made that a representative value of impedance of the fuel cell acquired during a trip of a vehicle traveling with the fuel cell as a power source is equal to or less than an impedance threshold, during the trip in which the impedance is acquired, calculate maximum output electric power of the fuel cell based on a current-voltage characteristic of the fuel cell based on a change of an output voltage of the fuel cell after a period in which the output voltage of the fuel cell is maintained in a range equal to or higher than a lower limit voltage and equal to or lower than a voltage threshold higher than the lower limit voltage over a predetermined period or more.

In a case where the representative value of impedance of the fuel cell acquired during the trip of the vehicle traveling with the fuel cell as a power source is equal to or less than the impedance threshold, the relative humidity inside the fuel cell is likely to become comparatively high, and determination can be made that the fuel cell is under a condition that the potential output performance of the fuel cell is likely to be sufficiently exhibited. The output voltage of the fuel cell is maintained in a range equal to or lower than the voltage threshold and higher than the lower limit voltage over the predetermined period or more, whereby it is possible to recover reversible degradation of the output performance of the fuel cell. The current-voltage characteristic of the fuel cell is a characteristic in a state in which reversible degradation of output performance is recovered. Such transition of the output voltage of the fuel cell may be caused by a driver's driving operation or the like. For this reason, since it is not necessary to control the fuel cell with high output separately from a driver's driving operation, the maximum output electric power of the fuel cell is calculated based on the current-voltage characteristic of the fuel cell in a state in which reversible degradation of output performance is recovered, while an increase in fuel consumption of the fuel cell is suppressed. As described above, under a condition that the potential output performance of the fuel cell is likely to be sufficiently exhibited, the maximum output electric power is calculated based on the current-voltage characteristic in a state in which reversible degradation of the output performance of the fuel cell is recovered by a driver's driving operation or the like, whereby it is possible to calculate the maximum output electric power potentially outputable from the fuel cell with high accuracy while suppressing an increase in fuel consumption of the fuel cell.

The representative value may be a maximum value or a minimum value of the impedance acquired during the trip.

The impedance threshold may be updated based on impedance of the fuel cell acquired during each of a plurality of last trips.

The calculation unit may calculate, as the maximum output electric power, output electric power that is predicted to be output in a case where an output current of the fuel cell becomes an upper limit current or in a case where the output voltage of the fuel cell becomes the lower limit voltage.

The output performance diagnosis apparatus may further include a notification control unit programmed to control a notification unit that gives notification of information relating to the calculated maximum output electric power.

The output performance diagnosis apparatus may further include a transmission unit programmed to transmit information relating to the calculated maximum output electric power in a wireless manner.

A second aspect of the disclosure relates to an output performance diagnosis system for a fuel cell. The output performance diagnosis system includes a plurality of the output performance diagnosis apparatuses for a fuel cell, and an information processing apparatus. The information processing apparatus generates image data for displaying information relating to a plurality of the maximum output electric power transmitted from the transmission units of the output performance diagnosis apparatuses for a fuel cell in a wireless manner.

A third aspect of the disclosure relates to an output performance diagnosis method for a fuel cell. The output performance diagnosis method includes determining whether a representative value of impedance of the fuel cell acquired during a trip of a vehicle traveling with a fuel cell as a power source is equal to or less than an impedance threshold, in a case where determination is made that the representative value of the impedance is equal to or less than the impedance threshold, during the trip in which the impedance is acquired, acquiring a current-voltage characteristic of the fuel cell based on a change of an output voltage of the fuel cell after a period in which the output voltage of the fuel cell is maintained in a range equal to or higher than a lower limit voltage and equal to or lower than a voltage threshold higher than the lower limit voltage over a predetermined period or more, and calculating maximum output electric power of the fuel cell based on the acquired current-voltage characteristic.

A fourth aspect of the disclosure relates to a non-transitory computer readable medium storing an output performance diagnosis program for a fuel cell. The output performance diagnosis program causes a computer to execute calculation processing for, in a case where determination is made that a representative value of impedance of the fuel cell acquired during a trip of a vehicle traveling with the fuel cell as a power source is equal to or less than an impedance threshold, during the trip in which the impedance is acquired, calculating maximum output electric power of the fuel cell based on a current-voltage characteristic of the fuel cell based on a change of an output voltage of the fuel cell after a period in which the output voltage of the fuel cell is maintained in a range equal to or higher than a lower limit voltage and equal to or lower than a voltage threshold higher than the lower limit voltage over a predetermined period or more.

It is possible to provide an output performance diagnosis apparatus for a fuel cell, an output performance diagnosis system for a fuel cell, an output performance diagnosis method for a fuel cell, and a non-transitory computer readable medium storing an output performance diagnosis program for a fuel cell capable of calculating maximum output electric power potentially outputable from the fuel cell with high accuracy while suppressing an increase in fuel consumption of the fuel cell.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
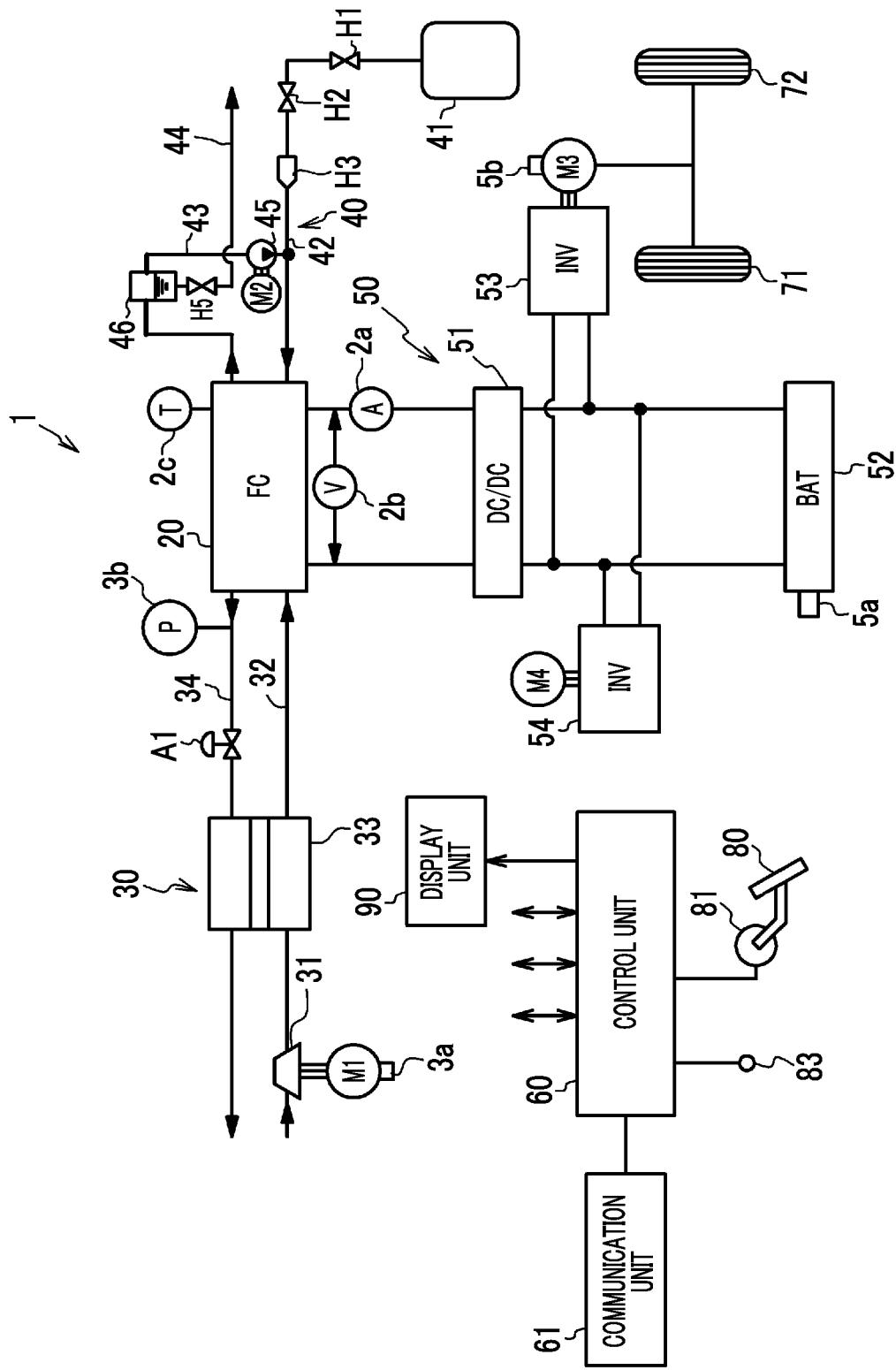
FIG. 1 is a configuration diagram of a vehicle.

FIG. 1 is a configuration diagram of a fuel cell vehicle 1 (hereinafter, simply referred to as a vehicle). As shown in FIG. 1, the vehicle 1 includes an oxidant gas piping system 30, a fuel gas piping system 40, an electric power system 50, and a control unit 60. A fuel cell 20 receives supply of oxidant gas and fuel gas, performs electric power generation, and generates electric power accompanied by electric power generation. The oxidant gas piping system 30 supplies air including oxygen as oxidant gas to the fuel cell 20. The fuel gas piping system 40 supplies hydrogen gas as fuel gas to the fuel cell 20. The electric power system 50 charges and discharges the system. The control unit 60 integrally controls the whole of the vehicle 1. The fuel cell 20 is a solid-state polymer electrolyte type, and has a stack structure in which a plurality of cells is stacked.

The fuel cell 20 is attached with a current sensor 2a and a voltage sensor 2b that detect an output current and a voltage, and a temperature sensor 2c that detects a temperature of the fuel cell 20.

The oxidant gas piping system 30 has an air compressor 31, an oxidant gas supply channel 32, a humidification module 33, a cathode off-gas flow channel 34, and a direct-current motor M1 that drives the air compressor 31.

The air compressor 31 is driven by the motor M1, compresses air (oxidant gas) including oxygen taken from outside air, and supplies compressed air to a cathode electrode of the fuel cell 20. The motor M1 is attached with a rotation speed detection sensor 3a that detects a rotation speed of the motor M1. The oxidant gas supply channel 32 introduces oxygen supplied from the air compressor 31 to the cathode electrode of the fuel cell 20. Cathode off-gas is discharged from the cathode electrode of the fuel cell 20 through the cathode off-gas flow channel 34.

The humidification module 33 performs moisture exchange between oxidant gas in a low moisture state flowing through the oxidant gas supply channel 32 and cathode off-gas in a high moisture state flowing through the cathode off-gas flow channel 34, and humidifies oxidant gas supplied to the fuel cell 20 as appropriate. The cathode off-gas flow channel 34 exhausts cathode off-gas outside the system, and a back pressure regulating valve A1 is disposed near an outlet of the cathode. Pressure of oxidant gas discharged from the fuel cell 20, that is, cathode back pressure is regulated by the back pressure regulating valve A1. A pressure sensor 3b that detects cathode back pressure is attached between the fuel cell 20 and the back pressure regulating valve A1 in the cathode off-gas flow channel 34.

The fuel gas piping system 40 has a fuel gas supply source 41, a fuel gas supply channel 42, a fuel gas circulation channel 43, an anode off-gas flow channel 44, hydrogen circulation pump 45, a gas-liquid separator 46, a motor M2 that drives the hydrogen circulation pump 45.

The fuel gas supply source 41 is a tank that supplies hydrogen gas as fuel gas to the fuel cell 20. The fuel gas supply channel 42 introduces fuel gas emitted from the fuel gas supply source 41 to an anode side of the fuel cell 20, and a tank valve H1, a hydrogen pressure regulating valve H2, and an injector H3 are disposed in this order from an upstream side. The valves and the injector are electromagnetic valves that supply and shut off fuel gas to the fuel cell 20.

The fuel gas circulation channel 43 recirculates unreacted fuel gas to the fuel cell 20, and the gas-liquid separator 46, the hydrogen circulation pump 45, and a check valve (not illustrated) are disposed in this order from the upstream side. Unreacted fuel gas discharged from the fuel cell 20 is pressurized by the hydrogen circulation pump 45 as appropriate and is introduced to the fuel gas supply channel 42. A backflow of fuel gas from the fuel gas supply channel 42 to the fuel gas circulation channel 43 is suppressed by the check valve. The anode off-gas flow channel 44 exhausts anode off-gas including hydrogen off-gas discharged from the fuel cell 20 or water stored in the gas-liquid separator 46 outside the system, and an exhaust/drain valve H5 is disposed in the anode off-gas flow channel 44.

The electric power system 50 includes a high-voltage DC/DC converter 51, a battery 52, a traction inverter 53, an accessory inverter 54, a traction motor M3, and an accessory motor M4.

The high-voltage DC/DC converter 51 can regulate a direct-current voltage from the fuel cell 20 and output the adjusted direct-current voltage to the battery 52. An output voltage of the fuel cell 20 is controlled by the high-voltage DC/DC converter 51.

The battery 52 is a rechargeable secondary battery, and can be charged with surplus electric power or supply supplementary electric power. Part of direct-current electric power generated by the fuel cell 20 is boosted or deboosted by the high-voltage DC/DC converter 51, and the battery 52 is charged with boosted or deboosted direct-current electric power. The battery 52 is attached with an SOC sensor 5a that detects a state of charge of the battery 52.

The traction inverter 53 and the accessory inverter 54 convert direct-current electric power output from the fuel cell 20 or the battery 52 to three-phase alternating-current electric power and supplies three-phase alternating-current electric power to the traction motor M3 and the accessory motor M4. The traction motor M3 drives wheels 71, 72. In a case where the traction motor M3 performs regeneration, output electric power from the traction motor M3 is converted to direct-current electric power through the traction inverter 53, and the battery 52 is charged with direct-current electric power. The traction motor M3 is attached with a rotation speed detection sensor 5b that detects a rotation speed of the traction motor M3.

The control unit 60 includes a central processing unit (CPU), a read only memory (ROM), a random access memory (RAM), and a memory, and integrally controls the units of the system based on input sensor signals. Specifically, the control unit 60 controls electric power generation of the fuel cell 20 based on sensor signals sent from an accelerator pedal sensor 81 that detects turning of an accelerator pedal 80, the SOC sensor 5a, and the rotation speed detection sensor 5b. The control unit 60 detects an on signal and an off signal from an ignition switch 83, thereby requesting for electric power generation start or electric power generation stop of the fuel cell 20. A display unit 90 that can give notification to an occupant by displaying information described below is connected to the control unit 60. The display unit 90 is, for example, a display provided in an instrument panel. A communication unit 61 is also connected to the control unit 60, and though details will be described below, the communication unit 61 can perform communication with a server through a network.

The control unit 60 calculates maximum output electric power potentially outputable from the fuel cell 20 at the present time, thereby executing output performance diagnosis control for diagnosing the output performance of the fuel cell 20. This control is executed by a determination unit, a characteristic acquisition unit, a calculation unit, an update unit, a notification control unit, and a transmission unit that are functionally realized by the CPU, the ROM, the RAM, and the memory of the control unit 60. The control unit 60 is an example of an output performance diagnosis apparatus of the fuel cell 20. Details will be described below.

Degradation of the output performance of the fuel cell 20 includes irreversible degradation with an increase in a use period of the fuel cell 20 and reversible degradation that can be recovered according to an operation state of the fuel cell 20. A main factor for irreversible degradation of output performance is an increase in proton moving resistance inside an electrolyte membrane accompanied by an increase in the amount of cationic impurity accumulated inside the electrolyte membrane of the fuel cell 20, rand sintering that noble metal (platinum) particles of a catalyst layer of the fuel cell 20 are aggregated to cause a decrease in a surface area of the noble metal particles. Such irreversible degradation of output performance gradually decreases with an increase in the use period of the fuel cell 20. In contrast, a main factor for reversible degradation of output performance is drying inside the fuel cell 20, or oxygen poisoning or sulfonic acid poisoning of the catalyst layer of the fuel cell 20. Drying inside the fuel cell 20 can be eliminated with an increase in the amount of generated water accompanied by electric power generation of the fuel cell 20. Oxygen poisoning of the catalyst layer can be eliminated with a decrease in the voltage of the fuel cell 20. Sulfonic acid poisoning of the catalyst layer can be eliminated in a case where the voltage of the fuel cell 20 decreases and liquid water exits plentifully inside the fuel cell 20. That is, reversible degradation of output performance can be recovered by decreasing the voltage of the fuel cell 20 so that relative humidity inside the fuel cell 20 is increased.

The operation state of the fuel cell 20 is controlled with high output, whereby it is possible to decrease the voltage of the fuel cell 20 so that the amount of generated water is increased due to electric power generation and the relative humidity is increased. Accordingly, it is considered that the operation state of the fuel cell 20 is controlled with high output in advance to recover reversible degradation of output performance, and in this state, the output performance of the fuel cell 20 is diagnosed to diagnose potential output performance of the fuel cell 20 at the present time. However, in this case, the fuel cell 20 should be operated with high output separately from a driver's driving operation or the like, and there is a possibility that the fuel consumption of the fuel cell 20 increases.

Figure 2A:
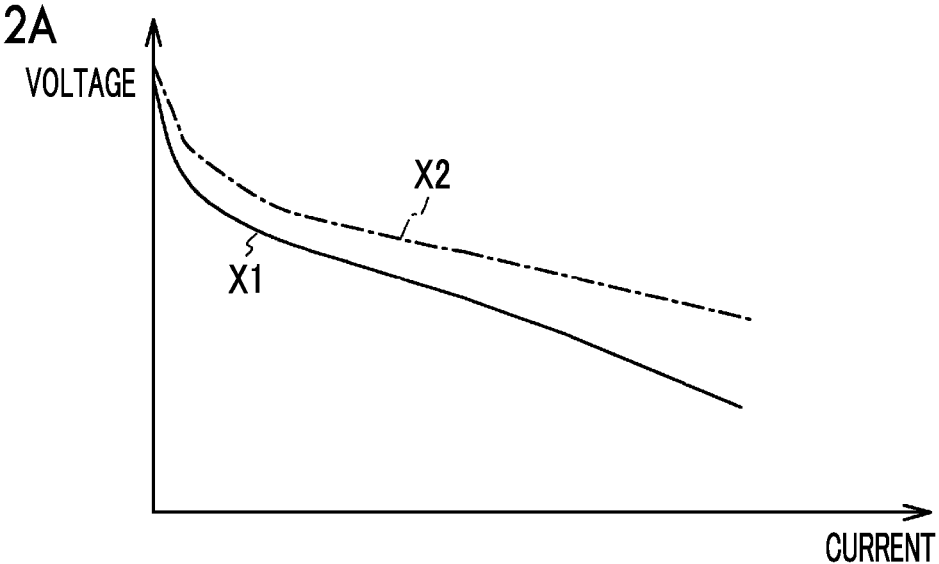
FIG. 2A is a graph showing an IV characteristic in a case where a fuel cell is operated under a condition that environmental humidity is different.
Figure 2B:
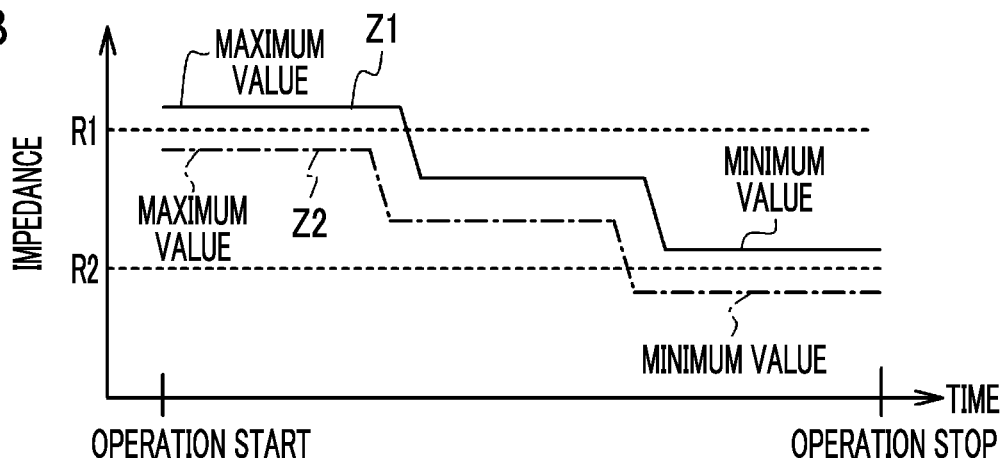
FIG. 2B is a graph showing change in impedance during operation in a case where the fuel cell is operated under a condition that environmental humidity is different.

Even in a state in which reversible degradation of output performance is recovered as described above, the relative humidity inside the fuel cell 20 is affected by a condition of environmental temperature or environmental humidity, an operation history of the fuel cell 20, or the like. Accordingly, even if the fuel cell 20 is controlled with high output as described above, there is a possibility that variation in the relative humidity inside the fuel cell occurs. For example, the output performance of the fuel cell 20 under a condition that the environmental humidity is low is lowered compared to a case where the environmental humidity is high. FIG. 2A is a graph showing an IV characteristic in a case where the fuel cell 20 is operated under a condition that the environmental humidity is different. The vertical axis and the horizontal axis indicate a voltage and a current, respectively. An IV characteristic X1 indicates an IV characteristic in a case where the fuel cell 20 is operated in a state in which the environmental humidity is lower than that in a case of an IV characteristic X2. FIG. 2B is a graph showing change in impedance during operation in a case where the fuel cell 20 is operated under a condition that the environmental humidity is different. The vertical axis indicates impedance, and the horizontal axis indicates time. Impedance Z1, Z2 correspond to the IV characteristics X1, X2, respectively, and the impedance Z1 is impedance in a case where the vehicle is driven in a state in which the environmental humidity is lower than that in a case of the impedance Z2. In both of FIGS. 2A and 2B, an environmental condition other than the environmental humidity or a condition of performance, an operation state, or the like of the fuel cell 20 to be used is identical.

As shown in FIG. 2A, the IV characteristic X1 under a condition that the environmental humidity shows that the output voltage decreases to be less than that in the IV characteristic X2, and indicates the output performance of the fuel cell 20 under a condition that the environmental humidity is low. As shown in FIG. 2B, the impedance Z1 under a condition that the environmental humidity is low becomes a value higher than the impedance Z2, and indicates that a resistive component of the fuel cell 20 under a condition that the environmental humidity is low increases. The reason is because the higher the relative humidity inside the fuel cell 20, the lower the impedance. In this way, the environmental humidity is reflected in the impedance of the fuel cell 20. Similarly, in a case where the amount of water vapor in air is constant, when the environmental temperature increases, the environmental humidity decreases, and when the environmental temperature decreases, the environmental humidity increases. For this reason, the environmental temperature is reflected in the impedance of the fuel cell 20. Furthermore, since the relative humidity inside the fuel cell 20 changes depending on the operation history of the fuel cell 20, the operation history is reflected in the impedance of the fuel cell 20. The impedance Z1, Z2 fluctuate according to the relative humidity inside the fuel cell 20 that changes depending on the operation state, are not constant during an operation period, and take a maximum value and a minimum value, respectively. While FIG. 2B shows a first impedance threshold R1 and a second impedance threshold R2 (hereinafter, simply referred to as thresholds R1, R2), details will be described below.

Figure 2C:
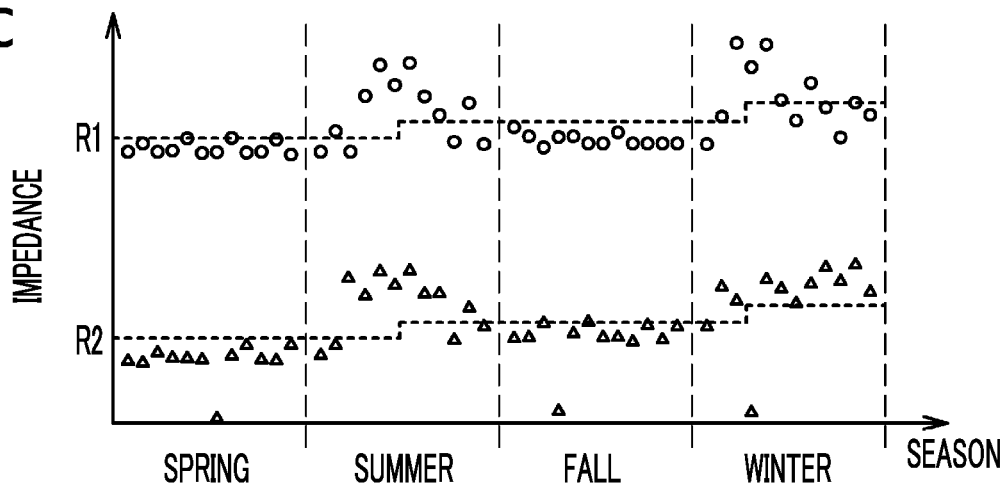
FIG. 2C is a graph showing a maximum value and a minimum value of impedance of the fuel cell in each trip of a vehicle measured for each season.

FIG. 2C is a graph showing a maximum value and a minimum value of the impedance of the fuel cell 20 in each trip of the vehicle 1 measured for each season. The vertical axis indicates impedance, and the horizontal axis indicates a season in which impedance is acquired. In FIG. 2C, the maximum value of the impedance is indicated by O, and the minimum value of the impedance is indicated by Δ. The term "trip" refers to a period until the ignition switch 83 is next switched from ON to OFF after switched from OFF to ON. In FIG. 2C, while the thresholds R1, R2 are shown, details will be described below.

As shown in FIG. 2C, while variations in the maximum value and the minimum value of the impedance are small in spring and fall, in summer and winter, the impedance becomes a high value and variations become large compared to in spring and fall. The reason that the impedance becomes high in summer compared to in spring and fall is because it is considered that the environmental temperature of the fuel cell 20 increases in summer and the relative humidity inside the fuel cell 20 is likely to decrease. The reason that variation in impedance becomes large in summer compared to in spring and fall is because it is considered that the difference in environmental humidity of the fuel cell 20 becomes large between fine weather and rainy weather even in summer, and even in a case where the environmental temperature is high, when the environmental humidity is high, such as in rainy weather, the relative humidity inside the fuel cell 20 becomes high. The reason that the impedance becomes high in winder compared to in spring and fall is because it is considered as follows. In a case where the environmental temperature is low, such as in winter, purging processing is executed for a long time in order to prevent freezing of residual water inside the fuel cell 20 during operation stop. As a result, operation is stopped in a state in which the inside of the fuel cell 20 is more dried than a case in spring and fall. Therefore, the relative humidity inside the fuel cell 20 at the time of operation restart is low. The reason that variation in impedance becomes large in winter compared to in spring and fall is because it is considered that environmental temperature and relative humidity of the fuel cell 20 largely depends on the weather even in winter. Variation in relative humidity inside the fuel cell 20 may be caused by an area where the vehicle 1 is used being changed from an arid area to a humid area as well as change of the seasons.

As above, since variation in the relative humidity inside the fuel cell 20 occurs according to environmental temperature and environmental humidity of the fuel cell 20 or an execution period of purging processing, as described above, even if potential output performance is diagnosed in an operation state in which reversible degradation of output performance is recovered, variation in relative humidity is reflected in a diagnosis result and there is a possibility that it is not possible to calculate the maximum output electric power potentially outputable from the fuel cell 20 with high accuracy.

Accordingly, the control unit 60 in this example determines whether the fuel cell 20 is under a condition suitable for diagnosis of the output performance of the fuel cell 20 based on a measurement result of the impedance of the fuel cell 20, and in a case where the fuel cell 20 is under a condition suitable for diagnosis, calculates the maximum output electric power potentially outputable from the fuel cell 20 with high accuracy. In regard to the impedance, a resistive component of the impedance of the fuel cell 20 is measured using, for example, an alternating-current impedance method. In a case where a frequency of a current applied to the fuel cell 20 is large ($\omega=\infty$) the impedance is electrolyte membrane resistance, and determination can be made whether a use environment of the fuel cell 20 is suitable for diagnosis of output performance based on electrolyte membrane resistance.

Figure 3:
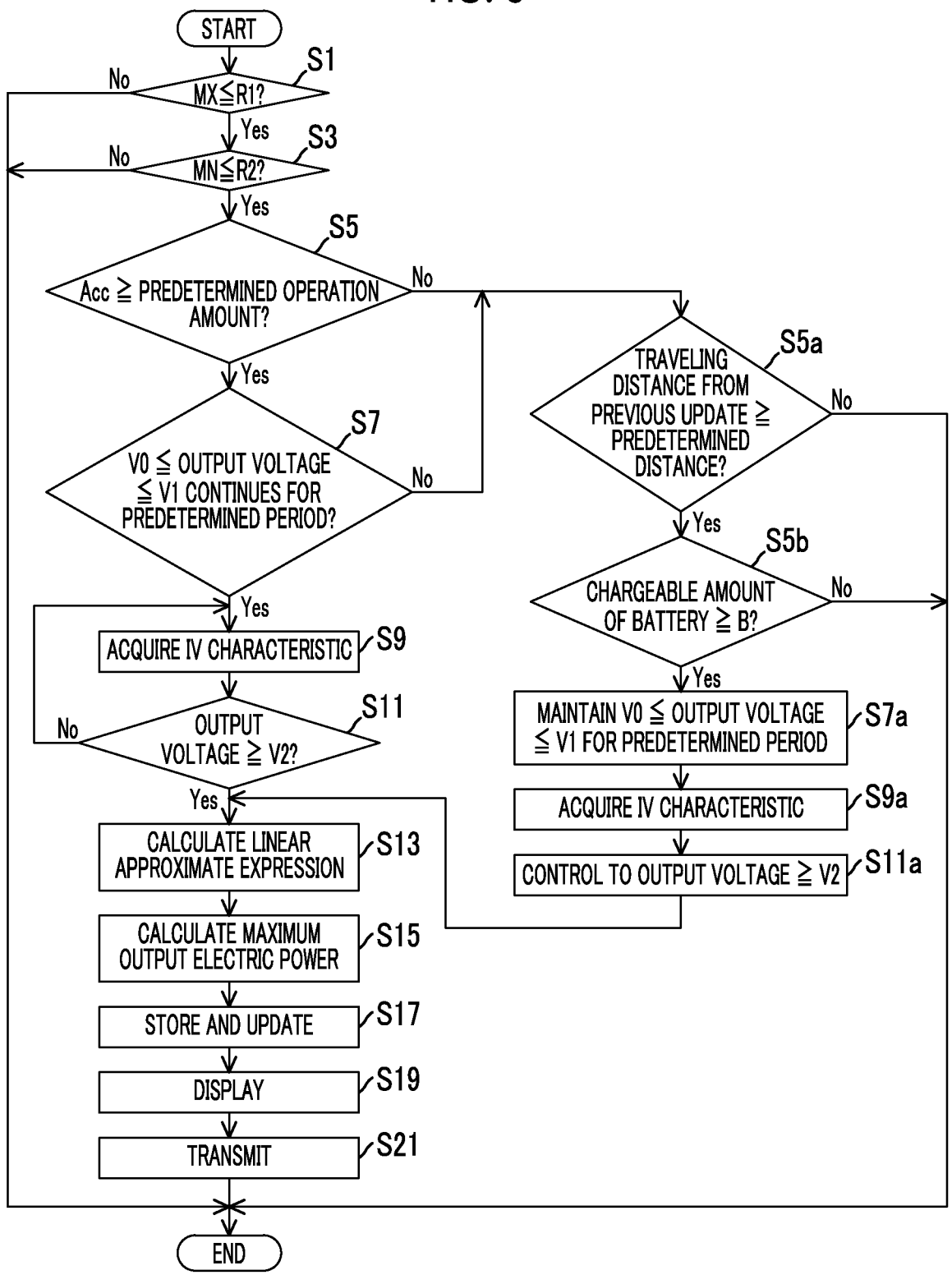
FIG. 3 is a flowchart showing an example of diagnosis control that is executed by a control unit.

FIG. 3 is a flowchart showing an example of diagnosis control that is executed by the control unit 60. The diagnosis control is executed by the control unit 60 repeatedly in a given cycle. First, determination is made whether a maximum value MX of the impedance of the fuel cell 20 acquired during a trip of the vehicle 1 is equal to or less than the threshold R1 (Step S1). The threshold R1 is a threshold for determining whether the fuel cell 20 is under a condition that the relative humidity inside the fuel cell 20 becomes comparatively high. During operation of the fuel cell 20, a measurement of the impedance is performed continuously in a given period, and the maximum value MX and a minimum value MN described below of the impedance during operation are acquired and updated as occasion demands. The maximum value MX and the minimum value MN are an example of a representative value of the impedance of the fuel cell 20 acquired during the trip of the vehicle 1. In a case where the determination in Step S1 is negative, this control ends.

In a case where the determination in Step S1 is affirmative, determination is made whether the minimum value MN of the impedance of the fuel cell 20 acquired during the trip of the vehicle 1 is equal to or less than the threshold R2 (Step S3). Similar to the threshold R1, the threshold R2 is a threshold for determining whether the fuel cell 20 is under a condition that the relative humidity inside the fuel cell 20 becomes comparatively high, and is a value smaller than the threshold R1. In a case where the determination is negative, this control ends. Calculation of the thresholds R1, R2 will be described below.

In Steps S1 and S3, determination is made whether the fuel cell 20 is under a condition suitable for diagnosis of output performance. For example, in the example of FIG. 2B, in a case of the impedance Z1, the determination in Step S1 is negative, and diagnosis of output performance is not executed. In a case of the impedance Z2, the determination in Steps S1 and S3 is affirmative when operation is substantially stopped, and diagnosis of output performance is executed. While the fuel cell 20 repeats electric power generation and electric power generation stop according to a charging rate of the battery 52 during one trip, it is considered that, in many cases, the use environment or the like of the fuel cell 20 is not significantly changed during one trip. For this reason, even in a case where electric power generation and electric power generation stop of the fuel cell 20 are repeated during one trip, determination is made whether the fuel cell 20 is under a condition suitable for diagnosis of output performance based on the representative value of the impedance acquired during the trip. The processing of Steps S1 and S3 is an example of processing that is executed by a determination unit configured to determine whether a representative value of impedance of the fuel cell 20 acquired during the trip of the vehicle 1 traveling with the fuel cell 20 is equal to or less than an impedance threshold.

The reason that the maximum value MX and the minimum value MN of the impedance are used in Steps S1 and S3 is because the relative humidity inside the fuel cell 20 fluctuates during operation of the fuel cell 20 as shown in FIG. 2B, and it is preferable to use the maximum value MX and the minimum value MN of the impedance during operation in order to determine the use environment of the fuel cell 20 using such impedance. While either of Step S1 or S3 may be executed, Steps S1 and S3 may be executed because it is possible to determine whether the fuel cell 20 is under a condition suitable for diagnosis of the output performance of the fuel cell 20 with high accuracy. The order of Steps S1 and S3 may be reversed. Although the maximum value MX and the minimum value MN are used as the representative value of the impedance of the fuel cell 20 acquired during the trip of the vehicle 1, an average value or a median value may be used. In a case of using the average value or the median value, a threshold corresponding to the average value or the median value should be used.

Next, determination is made whether the accelerator operation amount Acc of the accelerator pedal 80 operated by the driver is equal to or greater than a predetermined operation amount (Step S5). The predetermined operation amount means an operation amount in which an operation state is brought such that reversible degradation of the output performance of the fuel cell 20 can be recovered, and is an operation amount with high output such that the voltage of the fuel cell 20 is low and the amount of generated water due to electric power generation becomes large. The predetermined operation amount is, for example, 90%. In a case where the determination is negative, processing after Step S5a described below is executed. Step S5 may not necessarily be executed.

In a case where the determination in Step S5 is affirmative, determination is made whether a state in which the output voltage of the fuel cell 20 is equal to or higher than a lower limit voltage V0 and equal to or lower than a voltage threshold V1 continues for a predetermined period (Step S7). The voltage threshold V1 is set to a voltage such that the above-described poisoning can be eliminated and the amount of generated water due to electric power generation becomes large. The predetermined period is a period in which the amount of poisoning of the catalyst layer of the fuel cell 20 can be reduced, and is, for example, 30 seconds or more. The voltage of the fuel cell 20 is acquired based on the measurement result of the voltage sensor 2*b*. In a case where the determination is negative, the processing after Step S5*a* described below is executed.

In a case where the determination in Step S7 is affirmative, the IV characteristic of the fuel cell 20 is acquired based on the measurement results of the current sensor 2*a* and the voltage sensor 2*b* (Step S9). Next, determination is made whether the output voltage of the fuel cell 20 becomes equal to or higher than a voltage threshold V2 (Step S11). The voltage threshold V2 is a value greater than the voltage threshold V1. That is, the IV characteristic during a period in which the output voltage of the fuel cell 20 is changing in a range equal to or higher than the voltage threshold V1 and equal to or lower than the voltage threshold V2 is acquired. In a case where the determination is negative, the processing of Step S9 is continued. With this, the IV characteristic in a section of the voltage thresholds V1 and V2 is continuously acquired. With the processing of Steps S1 to S11 described above, under a condition that the use environment or the operation history of the fuel cell 20 is suitable for diagnosis of the output performance of the fuel cell 20, the IV characteristic in a state in which reversible degradation of output performance is recovered can be acquired in a case where the fuel cell 20 has high output according to a driver's driving operation. For this reason, it is possible to suppress an increase in fuel consumption of the fuel cell 20. The processing of Steps S9 and S11 is an example of processing that is executed by a characteristic acquisition unit configured to, in a case where the determination unit determines to be affirmative, during the trip in which the impedance is acquired, acquire a current-voltage characteristic of the fuel cell 20 during a period in which the output voltage of the fuel cell 20 is maintained in a range equal to or higher than a lower limit voltage and equal to or lower than a voltage threshold higher than the lower limit voltage over a predetermined period.

In Step S11, the voltage threshold V2 is not necessarily higher than the voltage threshold V1, and may be a value obtained by adding a predetermined voltage value to an output voltage when the condition of Step S7 is established and the acquisition of the IV characteristic starts. A current threshold may be used instead of the voltage threshold V2. Determination may be made whether an absolute value of the amount of change in the output voltage of the fuel cell 20 after the condition of Step S7 is established becomes equal to or greater than a predetermined amount. In this case, the output voltage may be changed to decrease or may be changed to increase. This is because, even during a period in which the output voltage is changed to increase, the IV characteristic can be acquired. Similarly, determination may be made whether an absolute value of the amount of change in output current of the fuel cell 20 after the condition of Step S7 is established becomes equal to or greater than a predetermined amount. In both cases, an IV characteristic in a section to such an extent that a linear approximate expression described below can be calculated may be acquired.

In a case where the determination in Step S11 is affirmative, a linear approximate expression where the acquired IV characteristic is approximated with a straight line is calculated (Step S13). Next, the maximum output electric power potentially outputable from the fuel cell 20 is calculated based on the linear approximate expression (Step S15). With the processing of Steps S1 to S15 described above, it is possible to calculate the maximum output electric power of the fuel cell 20 while suppressing an increase in fuel consumption of the fuel cell 20. The processing of Steps S13 and S15 is an example of processing that is executed by a calculation unit configured to calculate the maximum output electric power of the fuel cell 20 based on the acquired IV characteristic. Details will be described below.

Next, the calculated maximum output electric power is stored and updated in the memory of the control unit 60 (Step S17). Next, the maximum output electric power stored and updated in the memory of the control unit 60 is displayed on the display unit 90 (Step S19). With this, the maximum output electric power of the fuel cell 20 of the vehicle 1 is notified to the occupant. The processing of Step S19 is an example of processing that is executed by a notification control unit configured to control a notification unit that gives notification of information relating to the calculated maximum output electric power.

Next, the maximum output electric power information relating to the maximum output electric power stored and updated in the memory of the control unit 60 is transmitted from the communication unit 61 to the server through the network (Step S21). Details will be described below. The processing of Step S21 is an example of processing that is executed by a transmission unit configured to transmit information relating to the calculated maximum output electric power in a wireless manner. The maximum output electric power information is transmitted to the server in association with vehicle identification information, such as the registration number described on the number plate of the vehicle 1 or the frame number of the vehicle 1, and traveling distance information indicating a traveling distance of the vehicle 1. A fuel cell identification number, such as the serial number of the fuel cell, may be used instead of the vehicle identification information. The vehicle identification information and the traveling distance information are stored in the memory of the control unit 60, and the traveling distance information is updated as occasion demands. The order of Steps S19 and S21 does not matter. Details of Steps S19 and S21 will be described below.

Instead of Steps S5, S7, S9, S11, S13, and S15, it is considered that output electric power is calculated based on an output voltage and an output current of the fuel cell 20 in the middle of a state in which the accelerator operation amount Acc is full being continued over a predetermined period or more. However, even in this case, the accelerator operation amount Acc should be maintained to be full over the predetermined period in order to decrease the amount of poisoning of the catalyst layer of the fuel cell 20, and a frequency of a driver's operation on the accelerator pedal 80 in this manner is low. For this reason, in this example, as in Steps S5, S7, and S11, the maximum output electric power of the fuel cell 20 is calculated based on an IV characteristic acquired in an operation state in which the frequency of the driver's operation is higher. For this reason, it is possible to calculate the maximum output electric power of the fuel cell 20 with a higher frequency, and the maximum output electric power is updated to the latest maximum output electric power.

Next, in a case where the determination in Step S5 or S7 is negative, determination is made whether a traveling distance of the vehicle 1 from the update of previous maximum output electric power is equal to or longer than a predetermined distance (Step S5*a*). In a case where the determination is negative, this control ends. Instead of Step S5*a*, determination may be made whether a predetermined period elapses from the update of the previous maximum output electric power. The "predetermined distance" and the "predetermined period" are defined in advance in consideration of the traveling distance of the vehicle 1 and the use period of the fuel cell 20 for irreversibly decreasing the output performance of the fuel cell 20, respectively.

Next, determination is made whether a chargeable amount of the battery 52 is equal to or greater than a predetermined amount B based on the measured value of the SOC sensor 5a (Step S5b). In a case where the determination is negative, this control ends. This is because surplus generated electric power of the fuel cell 20 generated by execution of control described below should be stored in the battery 52.

In a case where the determination in Step S5b is affirmative, a requested output of the fuel cell 20 is increased regardless of the accelerator operation amount Acc, and the output voltage of the fuel cell 20 is maintained to be equal to or higher than the lower limit voltage V0 and equal to or lower than the voltage threshold V1 over a predetermined period (Step S7a). While the predetermined period is a period defined by the same purport as the predetermined period in Step S7, the predetermined period is not limited to the same period as the predetermined period in Step S7. In this way, it is possible to forcibly recover the fuel cell 20 from reversible degradation of output performance. Surplus generated electric power of the fuel cell 20 generated through this processing is stored in the battery 52.

Next, the IV characteristic of the fuel cell 20 is acquired based on the measurement results of the current sensor 2a and the voltage sensor 2b (Step S9a). Next, a requested output of the fuel cell 20 is decreased regardless of the accelerator operation amount Acc, and control is performed such that the voltage of the fuel cell 20 becomes equal to or higher than the voltage threshold V2 (Step S11a). With this, the IV characteristic in the section of the voltage thresholds V1 and V2 is acquired. Similarly to Step S11, in Step S11a, a current threshold may be used instead of the voltage threshold V2, or the output voltage of the fuel cell 20 may be changed by a predetermined amount. Next, the processing after Step S13 is executed. In the above-described manner, in a case where the fuel cell 20 is not brought into an operation state of high output suitable for diagnosis of potential output performance due to a driver's driving operation and diagnosis of output performance is not performed over a long period, diagnosis of potential output performance is forcibly performed. With this control, while the fuel consumption of the fuel cell 20 increases, the output performance of the fuel cell 20 can be diagnosed. The processing of Steps S5a to S11a may not necessarily be executed. However, there is a possibility that the operations of Steps S5 to S11 are not executed over a long period and the maximum output electric power is not updated to the latest maximum output electric power according to a driver's diving operation. For this reason, Steps S5a to S11a are executed, whereby the update of the maximum output electric power can be executed at an appropriate timing.

Instead of Steps S7a, S9a, S11a, S13, and S15, the output electric power of the fuel cell 20 may be maintained over a predetermined period in a state of being limited to either of an upper limit current or a lower limit voltage described below to eliminate reversible performance degradation, and the output electric power of the fuel cell 20 calculated thereafter may be set as the maximum output electric power potentially outputable from the fuel cell 20. In this case, since it is not necessary to execute the processing of Steps S9a, S13, and S15, it is possible to suppress a processing load of the control unit 60. In a case where Steps S7a, S9a, S11a, S13, and S15 are executed, since it is not necessary to control the output electric power of the fuel cell 20 to a maximum, it is possible to suppress an increase in fuel consumption.

Figure 4A:
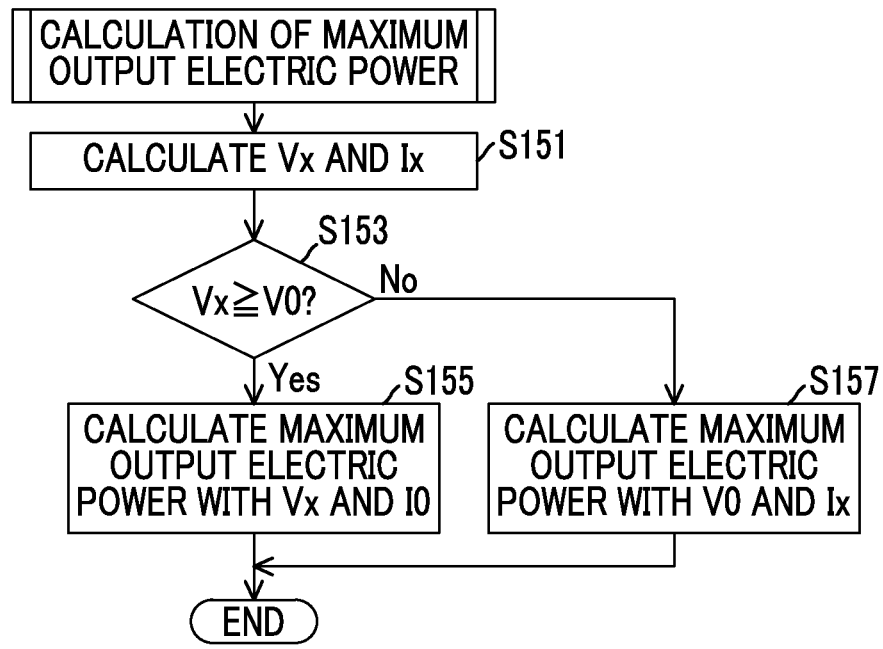
FIG. 4A is a flowchart showing an example of calculation processing of maximum output electric power of the fuel cell that is executed by the control unit.

The calculation processing of the maximum output electric power of the fuel cell 20 will be specifically described. FIG. 4A is a flowchart showing an example of the calculation processing of the maximum output electric power of the fuel cell 20 that is executed by the control unit 60. First, a predicted voltage Vx obtained by substituting an upper limit current I0 into the linear approximate expression calculated in Step S13 and a predicted current Ix obtained by substituting a lower limit voltage V0 into the linear approximate expression are calculated (Step S151). The predicted voltage Vx means an output voltage that is predicted in a case where the output current of the fuel cell 20 becomes the upper limit current I0, and the predicted current Ix means an output current that is predicted in a case where the output voltage of the fuel cell 20 becomes the lower limit voltage V0. The upper limit current I0 and the lower limit voltage V0 are specified in consideration of securing a normal operation of the vehicle 1, and are not a maximum current and a minimum voltage theoretically outputable from the fuel cell 20.

Next, determination is made whether the predicted voltage Vx is equal to or higher than the lower limit voltage V0 (Step S153). In a case where the determination is affirmative, the potential maximum output electric power of the fuel cell 20 is calculated by multiplication of the predicted value Vx and the upper limit current I0 (Step S155). In a case where the determination is negative, the potential maximum output electric power of the fuel cell 20 is calculated by multiplication of the predicted current Ix and the lower limit voltage V0 (Step S157).

Figure 4B:
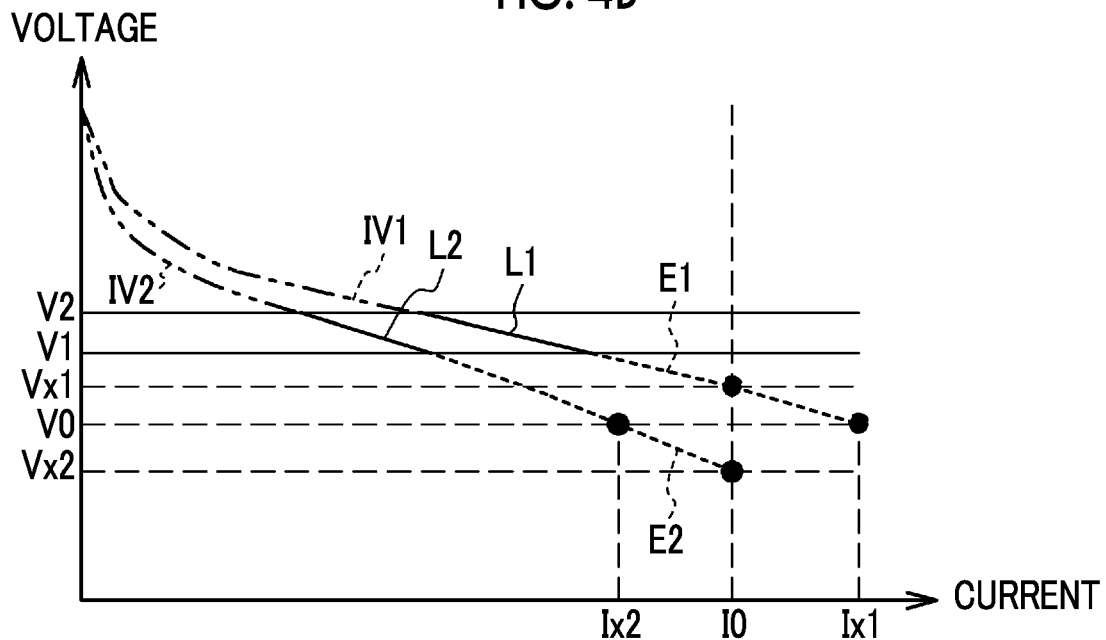
FIG. 4B is an explanatory view of calculation method of the maximum output electric power of the fuel cell.

FIG. 4B is an explanatory view of a calculation method of the maximum output electric power of the fuel cell 20. In FIG. 4B, the vertical axis and the horizontal axis indicate a voltage and a current, respectively. FIG. 4B shows IV curves IV1, IV2 of two fuel cells having different output performance. FIG. 4B also shows an approximation straight line L1 and an extension line E1 of the IV curve IV1 in the section of the voltage thresholds V1 and V2, and an approximation straight line L2 and an extension line E2 of the IV curve IV2 in the section of the voltage thresholds V1 and V2. FIG. 4B also shows predicted voltages Vx1, Vx2 corresponding to the upper limit current I0 on the extension lines E1, E2, and predicted currents Ix1, Ix2 corresponding to the lower limit voltage V0 on the extension lines E1, E2. As shown in FIG. 4B, the approximation straight line L2 and the extension line E2 decrease in voltage to be lower than the approximation straight lines L1 and the extension line E1, and this means that the fuel cell corresponding to the IV curve IV2 has potential output performance lower than that of the fuel cell corresponding to the IV curve IV1.

In the extension line E1, since the predicted current Ix1>the upper limit current I0 and the predicted voltage Vx1>the lower limit voltage V0, and the output current does not become the predicted current Ix1 exceeding the upper limit current I0, the potential maximum output electric power of the fuel cell corresponding to the IV curve IV1 is calculated through processing of Step S155. In the extension line E2, since the predicted current Ix2<the upper limit current I0 and the predicted voltage Vx2<the lower limit voltage V0, and the output voltage does not become the predicted voltage Vx2 below the lower limit voltage V0, the maximum output electric power potential of the fuel cell corresponding to the IV curve IV2 is calculated through processing of Step S157. In the above-described manner, the potential maximum output electric power of the fuel cell is calculated. Instead of Step S153, determination may be made whether the predicted current Ix exceeds the upper limit current I0.

As described above, the potential maximum output electric power of the fuel cell 20 is calculated based on the IV characteristic in the section of the voltage thresholds V1 and V2 after the output voltage of the fuel cell 20 is maintained to be equal to or lower than the voltage threshold V1 over the predetermined period. For this reason, the output voltage of the fuel cell 20 is maintained to be equal to or lower than the voltage threshold V1 over the predetermined period and the IV characteristic is acquired instantly in a state where the amount of poisoning to the catalyst layer is lowered. Therefore, it is possible to the IV characteristic immediately after reversible degradation of the output performance of the fuel cell 20 is recovered, and to calculate the potential maximum output electric power of the fuel cell 20 with high accuracy.

Based on the IV characteristic in the section of the voltage thresholds V1 and V2 and the extension line thereof, output electric power at each operation point on the line may be calculated within an allowable range with the upper limit current I0 and the lower limit voltage V0, and a maximum value of the output electric power may be set as maximum output electric power.

In Step S13, although the linear approximate expression is calculated based on the IV characteristic in the section of the voltage thresholds V1 and V2, a linear approximate expression may be calculated based on an IV characteristic in a section shorter than the section of the voltage thresholds V1 and V2. For example, a linear approximate expression may be calculated using an IV characteristic in a section from the voltage threshold V1 halfway between the voltage threshold V1 and the voltage threshold V2. This is because, in a case where the IV characteristic in the section of the voltage thresholds V1 and V2 is curved, a linear approximate expression is calculated using an IV characteristic in a short section on a side as close to the voltage threshold V1, and the potential maximum output electric power of the fuel cell 20 can be calculated with high accuracy.

Figure 5:
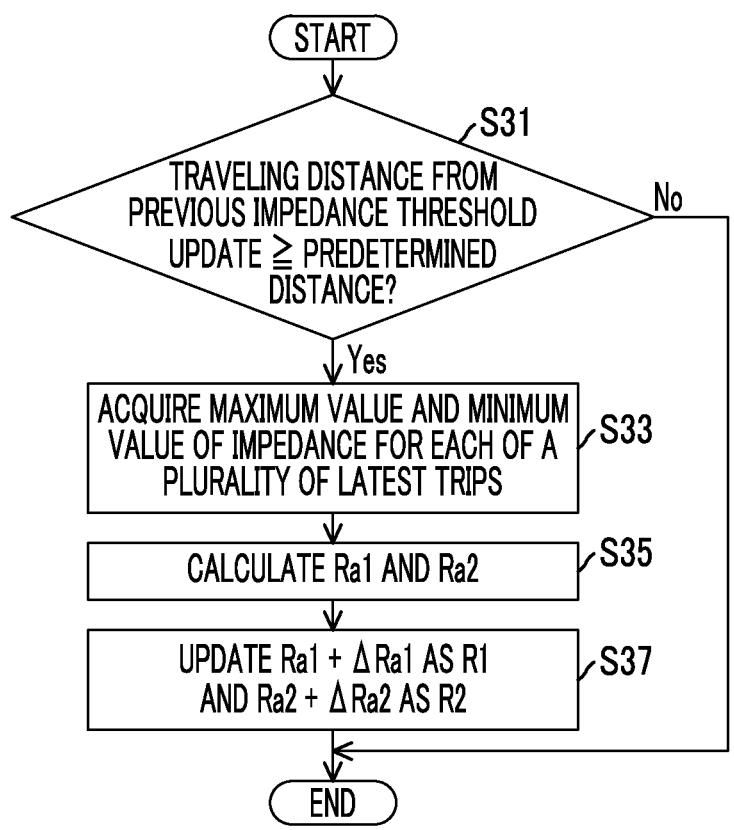
FIG. 5 is a flowchart showing an example of update control of an impedance threshold that is executed by the control unit.

Next, the thresholds R1, R2 will be described. The thresholds R1, R2 are not fixed values that are always constant, and are values to be updated. The update of the thresholds R1, R2 is performed in consideration of output performance to be irreversibly degraded along with an increase in the use period of the fuel cell 20. This is because, when the use period of the fuel cell 20 is longer, output performance is irreversibly degraded, and impedance becomes a high value. FIG. 5 is a flowchart showing an example of update control of the thresholds R1, R2 that is executed by the control unit 60. First, determination is made whether the traveling distance of the vehicle becomes equal to or longer than a predetermined distance after the update of the previous thresholds R1, R2 is performed (Step S31). In a case where the determination is negative, this control ends. Instead of Step S31, for example, determination may be made whether a predetermined period elapses from the update of the previous thresholds R1, R2. The "predetermined distance" and the "predetermined period" are respectively defined in advance in consideration of the traveling distance of the vehicle 1 and the use period of the fuel cell 20 which are required for irreversibly decreasing the output performance of the fuel cell 20.

Next, a maximum value and a minimum value of impedance for each of a plurality of last trips are acquired (Step S33). The maximum value and the minimum value of the impedance for each trip are stored in the memory of the control unit 60.

Next, an average value Ra1 of n-th (n≥2) to m-th (m≥(n+1)) maximum values in an ascending order among a plurality of acquired maximum values is calculated, and an average value Ra2 of n-th (n≥2) to m-th (m≥(n+1)) minimum values in an ascending order among a plurality of acquired minimum values is calculated (Step S35).

Next, values obtained by adding predetermined values ΔRa1, ΔRa2 to the calculated average values Ra1, Ra2, respectively, are updated as the thresholds R1, R2 (Step S37). A plurality of last times is a sufficiently large number for excluding measurement variation, and is, for example, 100 times, and the n-th to the m-th are 10th to 20th. The reason that the first to (n−1)th values are excluded is to exclude an error included in the measurement result of the impedance. For example, as shown in FIG. 2C, the thresholds R1, R2 are updated. The processing of Step S37 is an example of processing that is executed by an update unit configured to update a value calculated based on an average value of at least one of a maximum value and a minimum value of impedance of the fuel cell 20 for each last trip as an impedance threshold.

Instead of Step S31 described above, determination may be made whether the thresholds R1, R2 are updated during a current trip. That is, the processing after Step S33 may be executed each time the operation of the fuel cell 20 is started.

In Step S35, an average value Rb1 and a standard deviation 61 of all of the acquired maximum values may be calculated, and an average value Rb2 and a standard deviation σ2 of all of the acquired minimum values may be calculated. In Step S37, a value obtained by subtracting the standard deviation σ1 from the average value Rb1 may be updated as the threshold R1, and a value obtained by subtracting the standard deviation σ2 from the average value Rb2 may be updated as the threshold R2. Furthermore, a value obtained by subtracting a value obtained by multiplying the standard deviation σ1 by a predetermined coefficient k (0<k<1 or k>1) from the average value Rb1 may be updated as the threshold R1. The same applies to the threshold R2. The thresholds R1, R2 may be functions that increase with an increase in the traveling distance of the vehicle 1.

In a case where either of Step S1 or S3 is executed in the diagnosis control shown in FIG. 3, in the update control of FIG. 5, the corresponding threshold may be updated exclusively. The thresholds R1, R2 are set to initial values calculated in advance by an experiment before the update.

Figure 6:
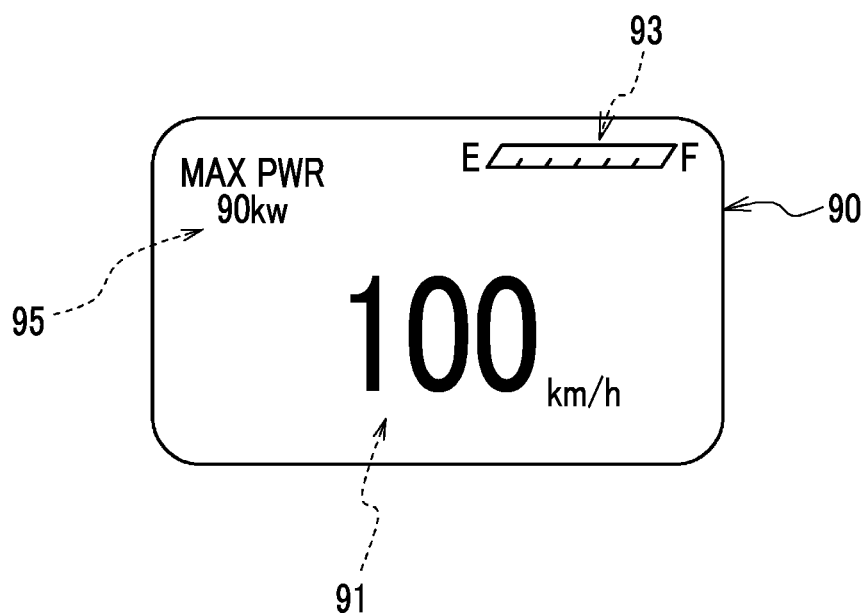
FIG. 6 is a diagram showing a display example of the maximum output electric power on a display unit.

As described above, information relating to the calculated maximum output electric power of the fuel cell 20 is displayed on the display unit 90. FIG. 6 is a diagram showing a display example of maximum output electric power on the display unit 90. A vehicle speed display region 91 where information relating to vehicle speed is displayed is set at the center of the display unit 90, a fuel gas amount display region 93 where information relating to the storage amount of fuel gas is displayed is set on an upper right side of the display unit 90, and a maximum output display region 95 where information relating to the maximum output electric power of the fuel cell 20 described above is displayed is set on an upper left side of the display unit 90. The control unit 60 displays the calculated maximum output electric power value of the fuel cell 20 in the maximum output display region 95, thereby giving notification to the occupant. The maximum output electric power of the fuel cell 20 may be continuously displayed on the display unit 90, or may be displayed on the display unit 90 each time an operation switch or the like is operated by the occupant. A display form of information relating to maximum output electric power is not limited that shown in FIG. 6, and for example, information relating to maximum output electric power may be displayed by an indicator without using a specific numerical value, or may be displayed by a character, a figure, a pattern, or the like. The control unit 60 may give a notification of information relating to maximum output electric power to the occupant by sound from a speaker in the vehicle.

Figure 7:
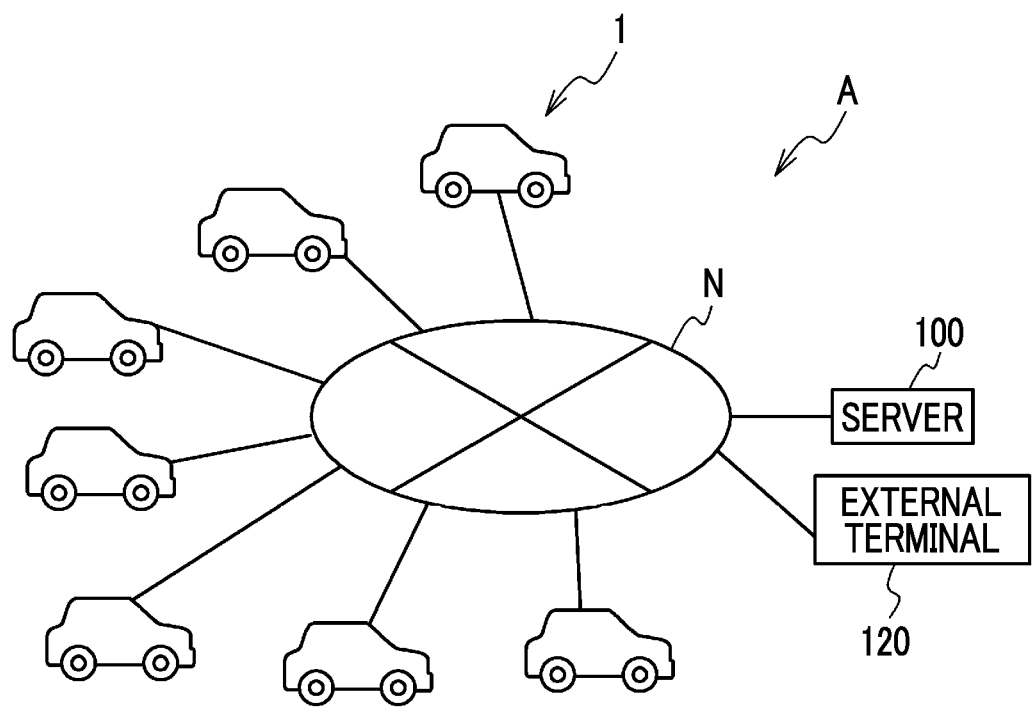
FIG. 7 is a configuration diagram of an output performance diagnosis system.

Next, an output performance diagnosis system A will be described. FIG. 7 is a configuration diagram of the output performance diagnosis system A. In the output performance diagnosis system A, vehicles 1, a server 100, and an external terminal 120 are connected to a network N, such as the Internet. The control unit 60 having the above-described functions is mounted in each of a plurality of vehicles 1 shown in FIG. 7. The control unit 60 of each vehicle 1 is connected to the network N, and information of maximum output electric power of each vehicle 1 is transmitted to the server 100. The server 100 executes predetermined processing to transmit information relating to the maximum output electric power of the fuel cells 20 of the vehicles 1 to the external terminal 120. Hereinafter, the server 100 and the external terminal 120 will be described.

Figure 8A:
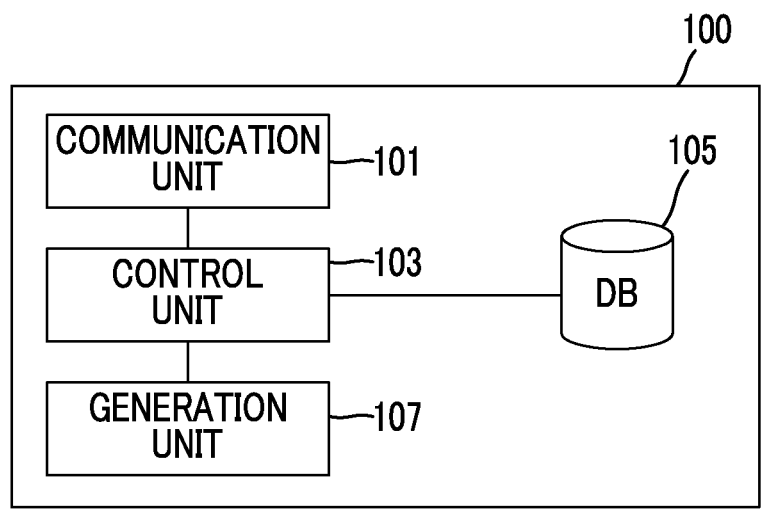
FIG. 8A is a configuration diagram of a server.

FIG. 8A is a configuration diagram of the server 100. The server 100 includes a communication unit 101, a control unit 103, a database 105, and a generation unit 107. The communication unit 101 is a network interface that can perform communication with the control unit 60 and the external terminal 120, receives the maximum output electric power information, the vehicle identification information, and the traveling distance information transmitted from the control units 60 of the vehicles 1, and transmits the maximum output electric power information, the vehicle identification information, and the traveling distance information to the control unit 103. The control unit 103 stores and updates the maximum output electric power information and the traveling distance information in the database 105 in association with the vehicle identification information. With this, the vehicle identification information, the maximum output electric power information, and the traveling distance information relating to the vehicles 1 are stored in the database 105. As shown in FIG. 7, since the vehicles 1, in which the control unit 60 that executes the above-described diagnosis control is mounted, are connected to the server 100 through the network N, information relating to the vehicles 1 is stored and updated in the database 105. The generation unit 107 generates image data for displaying information on the external terminal 120 based on information stored in the database 105 according to a command from the control unit 103. The generated image data is transmitted from the communication unit 101 to the external terminal 120 by the control unit 103.

Figure 8B:
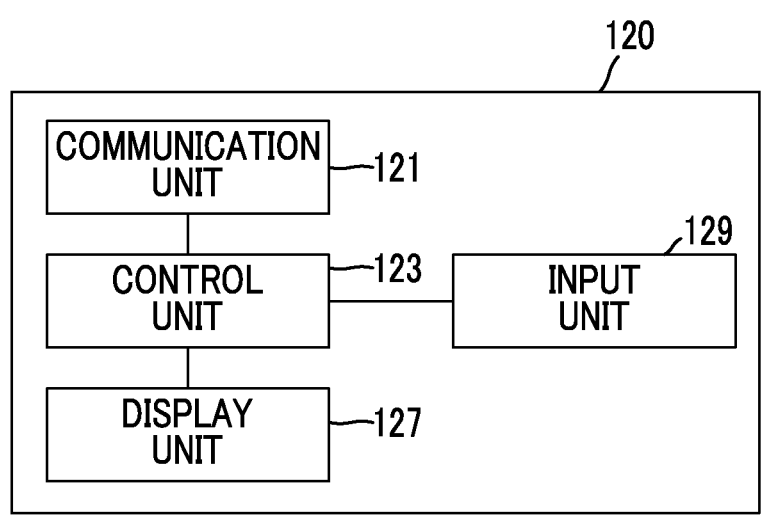
FIG. 8B is a configuration diagram of an external terminal.

FIG. 8B is a configuration diagram of the external terminal 120. The external terminal 120 includes a communication unit 121, a control unit 123, a display unit 127, and an input unit 129. The communication unit 121 is a network interface that can perform communication with the server 100, receives image data transmitted from the server 100, and transmits image data to the control unit 123. The control unit 123 is constituted of a CPU, a ROM, a RAM, and the like, and displays image data transmitted from the server 100 on the display unit 127. The display unit 127 is, for example, a display. The input unit 129 is, for example, a keyboard, a touch panel, or the like. Although the external terminal 120 is a stationary computer that is installed in, for example, a used vehicle dealer or the like, the disclosure is not limited thereto, and a portable computer may be applied.

Figure 9A:
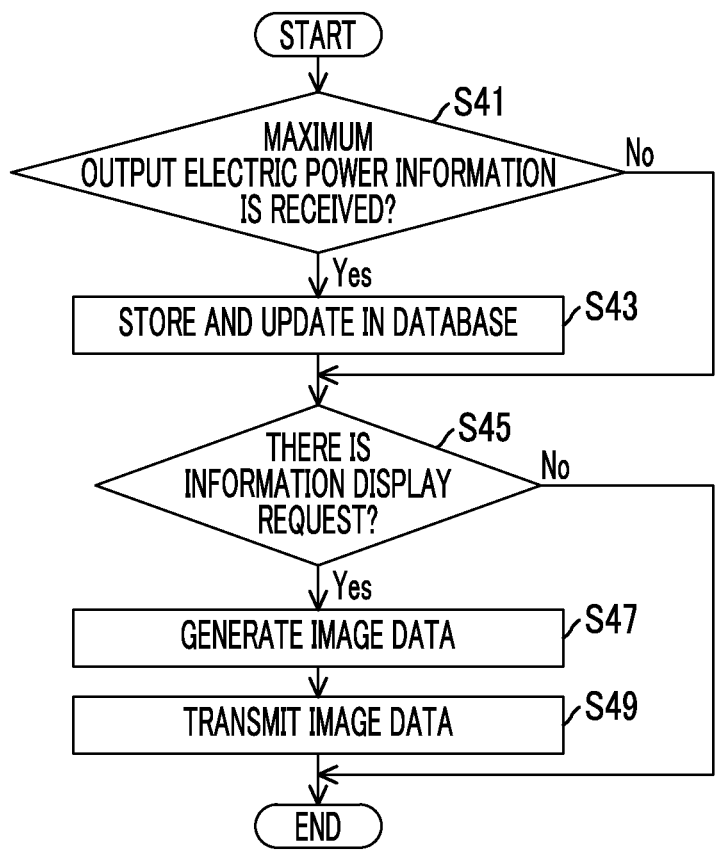
FIG. 9A is a flowchart showing an example of control that is executed by a control unit of the server.

FIG. 9A is a flowchart showing an example of control that is executed by the control unit 103 of the server 100. Determination is made whether information transmitted from the control units 60 of the vehicles 1 is received (Step S41). In a case where the determination is affirmative, the received information is stored and updated in the database 105 (Step S43). In a case where the determination is negative and after the processing of Step S43, determination is made whether there is a request for displaying information relating to maximum output electric power from the external terminal 120 (Step S45). For example, in a case where the vehicle identification information of a specific vehicle is input from the input unit 129 of the external terminal 120, the information display request is made from the communication unit 121 of the external terminal 120 to the server 100 through the network N. In a case where the determination is negative, this control ends. In a case where the determination is affirmative, image data for displaying information on the display unit 127 of the external terminal 120 is generated based on information stored in the database 105 by the generation unit 107 (Step S47). The generated image data is transmitted to the external terminal 120 through the network N by the communication unit 101 (Step S49). In this way, the server 100 is an example of an information processing apparatus that generates image data for displaying information relating to a plurality of maximum output electric power transmitted from the control units 60 in a wireless manner.

Figure 9B:
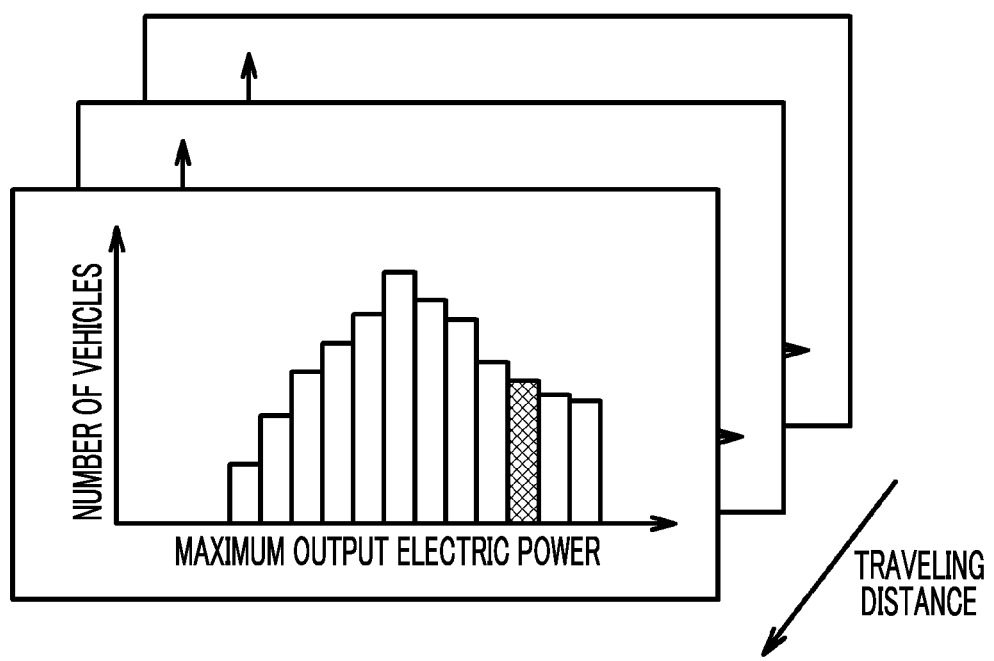
FIG. 9B shows an example of a screen that is displayed on a display unit of the external terminal based on image data generated by the server.

FIG. 9B shows an example of a screen that is displayed on the display unit 127 of the external terminal 120 based on image data generated by the server 100. Image data in which the number of vehicles and the maximum output electric power are classified for each traveling distance and shown in a bar graph is generated by the generation unit 107, and is displayed on the display unit 127 of the external terminal 120. With this, a user of the external terminal 120 can ascertain output performance of vehicles that are distributed in a market at the present time, and can use the output performance of the vehicles as materials for determining used vehicle selling prices of such fuel cell vehicles or an average price of used vehicle purchase prices. In image data, the maximum output electric power of the specific vehicle and other vehicles are displayed distinguishably based on the specific vehicle identification information input from the input unit 129. Specifically, in FIG. 9B, a hatched portion shows the maximum output electric power of the specific vehicle. With this, the user of the external terminal 120 can compare the output performance of the specific vehicle and the output performance of other vehicles, and can use the comparison result as a material for determining a purchase price or a selling price of the specific vehicle. The server 100 may transmit image data to the control unit 60 of each vehicle 1 as well as the external terminal 120, and may display information relating to the maximum output electric power on the display unit 90 of each vehicle 1. An owner of each vehicle 1 can ascertain the present output performance of the host vehicle in comparison with other vehicles, and for example, can use the present output performance of the vehicle as a material for expecting a trade-in price of the host vehicle 1.

Not only the generation unit 107 of the server 100 may generate image data for displaying information on the display unit 127, but also the control unit 123 of the external terminal 120 may generate image data for displaying information on the display unit 127 based on information transmitted from the server 100.

The control unit 60 of the vehicle 1 may continuously transmit information relating to the impedance, the output current, the output voltage, the accelerator operation amount, the traveling distance, and the like of the fuel cell 20 to the server 100 along with the vehicle identification information of the host vehicle, and the control unit 103 may acquire these kinds of information and store and update information in the database 105, and the control unit 103 may execute the diagnosis control of FIG. 3 or the update control of FIG. 5 based on these kinds of information. That is, the control shown in FIGS. 3, 4A, and 5 may not necessarily be executed by the control unit 60 of the vehicle 1, and may be executed by the control unit 103 of the server 100. In this case, the control unit 103 functions as a determination unit, a characteristic acquisition unit, a calculation unit, an update unit, and a notification control unit, and functions as an output performance diagnosis apparatus of the fuel cell 20. In this case, the calculated maximum output electric power is stored and updated in the database 105 along with the vehicle identification information of the vehicle 1, is transmitted from the communication unit 101 to the control unit 60 of the vehicle 1, and is displayed on the display unit 90.

The diagnosis control of FIG. 3 may be executed by cooperation of the control unit 60 and the control unit 103. For example, the processing of Steps S1 to S11 and S5*a* to S11*a* may be executed by the control unit 60 of the vehicle 1, and the processing of Steps S13 to S21 may be executed by the control unit 103 of the server 100. In this case, the control unit 60 of the vehicle 1 transmits information relating to the acquired IV characteristic from the communication unit 61 to the server 100. The control unit 103 of the server 100 calculates the maximum output electric power based on the acquired IV characteristic, transmits information relating to the maximum output electric power to the control unit 60 of the vehicle 1, and displays the information relating to the maximum output electric power on the display unit 90. Furthermore, the control unit 103 of the server 100 transmits information relating to the maximum output electric power to the external terminal 120 and displays information relating to the maximum output electric power on the display unit 127. In this case, the control unit 60 of the vehicle 1 functions as a determination unit and a characteristic acquisition unit, and the control unit 103 of the server 100 functions as a calculation unit.

The above-described processing functions can be realized by a computer. In this case, a program in which the processing contents of the functions to be provided in the processing apparatus are described is provided. The program is executed on the computer, whereby the above-described processing functions are realized on the computer. The program in which the processing contents are described can be recorded in a computer readable recording medium (however, a carrier wave is excluded).

In a case where the program is distributed, for example, the program is sold in the form of a portable recording medium, such as a digital versatile disc (DVD) or a compact disc read only memory (CD-ROM), in which the program is recorded. The program may be stored in a storage device of a server computer and may be transferred from the server computer to other computers through a network.

The computer on which the program is executed stores the program recorded in the portable recording medium or the program transferred from the server computer in a storage device thereof. Then, the computer reads the program from the storage device thereof and executes processing according to the program. The computer may the program directly from the portable recording medium and may execute the processing according to the program. Furthermore, each time the program is transferred from the server computer, the computer may execute processing according to the received program sequentially.

Although the preferred embodiment of the disclosure has been described above in detail, the disclosure is not limited to a specific embodiment, and various modifications and alterations may be made.

What is claimed is:

1. An output performance diagnosis apparatus for a fuel cell comprising;
    a calculation unit programmed to determine a representative value of impedance of the fuel cell acquired during a trip of a vehicle traveling with the fuel cell as a power source is equal to or less than an impedance threshold; upon determination that the representative value of impedance is equal to or less than the impedance threshold, during the trip in which the impedance is acquired, acquire a current-voltage characteristic of the fuel cell based on a change of an output voltage of the fuel cell after a period in which the output voltage of the fuel cell is maintained in a range equal to or higher than a lower limit voltage and equal to or lower than a voltage threshold higher than the lower limit voltage over a predetermined period or more, and calculate maximum output electric power of the fuel cell based on the current-voltage characteristic of the fuel cell.

2. The output performance diagnosis apparatus according to claim 1, wherein the representative value is a maximum value or a minimum value of the impedance acquired during the trip.

3. The output performance diagnosis apparatus according to claim 1, wherein the impedance threshold is updated based on impedance of the fuel cell acquired during each of a plurality of last trips.

4. The output performance diagnosis apparatus according to claim 1, wherein the calculation unit calculates, as the maximum output electric power, output electric power that is predicted to be output in a case where an output current of the fuel cell becomes an upper limit current or in a case where the output voltage of the fuel cell becomes the lower limit voltage.

5. The output performance diagnosis apparatus according to claim 1, further comprising:
    a notification control unit programmed to control a notification unit that gives notification of information relating to the calculated maximum output electric power.

6. The output performance diagnosis apparatus according to claim 1, further comprising:
    a transmission unit programmed to transmit information relating to the calculated maximum output electric power in a wireless manner.

7. An output performance diagnosis system for a fuel cell comprising:
    a plurality of the output performance diagnosis apparatuses according to claim 6; and
    an information processing apparatus that generates image data for displaying information relating to a plurality of the maximum output electric power transmitted from the transmission units of the output performance diagnosis apparatuses in a wireless manner.

8. An output performance diagnosis method for a fuel cell comprising:
    determining a representative value of impedance of the fuel cell acquired during a trip of a vehicle traveling with the fuel cell as a power source is equal to or less than an impedance threshold;

upon determination that the representative value of the impedance is equal to or less than the impedance threshold, during the trip in which the impedance is acquired, acquiring a current-voltage characteristic of the fuel cell based on a change of an output voltage of the fuel cell after a period in which the output voltage of the fuel cell is maintained in a range equal to or higher than a lower limit voltage and equal to or lower than a voltage threshold higher than the lower limit voltage over a predetermined period or more; and calculating maximum output electric power of the fuel cell based on the acquired current-voltage characteristic.

9. A non-transitory computer readable medium storing an output performance diagnosis program for a fuel cell causing a computer to execute:

calculation processing for determining a representative value of impedance of the fuel cell acquired during a trip of a vehicle traveling with the fuel cell as a power source is equal to or less than an impedance threshold, and for, upon determination that the representative value of impedance is equal to or less than the impedance threshold, during the trip in which the impedance is acquired, acquiring a current-voltage characteristic of the fuel cell based on a change of an output voltage of the fuel cell after a period in which the output voltage of the fuel cell is maintained in a range equal to or higher than a lower limit voltage and equal to or lower than a voltage threshold higher than the lower limit voltage over a predetermined period or more, and calculate maximum output electric power of the fuel cell based on the current-voltage characteristic of the fuel cell.

* * * * *